United States Patent
Panda et al.

(10) Patent No.: US 6,709,917 B2
(45) Date of Patent: Mar. 23, 2004

(54) METHOD TO INCREASE THE ETCH RATE AND DEPTH IN HIGH ASPECT RATIO STRUCTURE

(75) Inventors: Siddhartha Panda, Beacon, NY (US); Rajiv M. Ranade, Brewster, NY (US); Gangadhara S. Mathad, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 10/145,230

(22) Filed: May 13, 2002

(65) Prior Publication Data

US 2003/0211686 A1 Nov. 13, 2003

(51) Int. Cl.[7] .......................................... H01L 21/8242
(52) U.S. Cl. .................... 438/243; 438/386; 438/735
(58) Field of Search ................. 438/243–249, 438/690, 386–392, 735

(56) References Cited

U.S. PATENT DOCUMENTS

| 5,970,376 | A |   | 10/1999 | Chen |
| 6,046,115 | A |   | 4/2000  | Molloy et al. |
| 6,071,823 | A | * | 6/2000  | Hung et al. ................. 438/719 |
| 6,127,278 | A |   | 10/2000 | Wang et al. |
| 6,303,513 | B1 | * | 10/2001 | Khan et al. ................. 438/714 |
| 6,318,384 | B1 | * | 11/2001 | Khan et al. ................. 134/22.1 |
| 6,387,773 | B1 | * | 5/2002  | Engelhardt ................. 438/386 |

OTHER PUBLICATIONS

U.S. patent application—S/N 09/675,433, filed Sep. 29, 2000, entitled "Deep trench etching method to reduce/eliminate formation of black silicon".

* cited by examiner

*Primary Examiner*—Thanh Nguyen
(74) *Attorney, Agent, or Firm*—Steven Capella

(57) ABSTRACT

A method of fabricating a high aspect ratio deep trench in a semiconductor substrate comprising reducing the formation of a passivation film during the etching of the trench by including a first step of contacting the substrate in which the deep trench is to be formed with a fluorine poor or low concentration of a fluorine gas in the plasma of etchant gases for etching the high aspect ratio deep trench, followed by a second step of increasing the concentration of the fluorine containing gas to create a fluorine-rich plasma while lowering the chamber pressure of the reactor and RF power. Preferably, the second step is introduced periodically during the etching of a deep trench in an alternating manner.

18 Claims, 4 Drawing Sheets

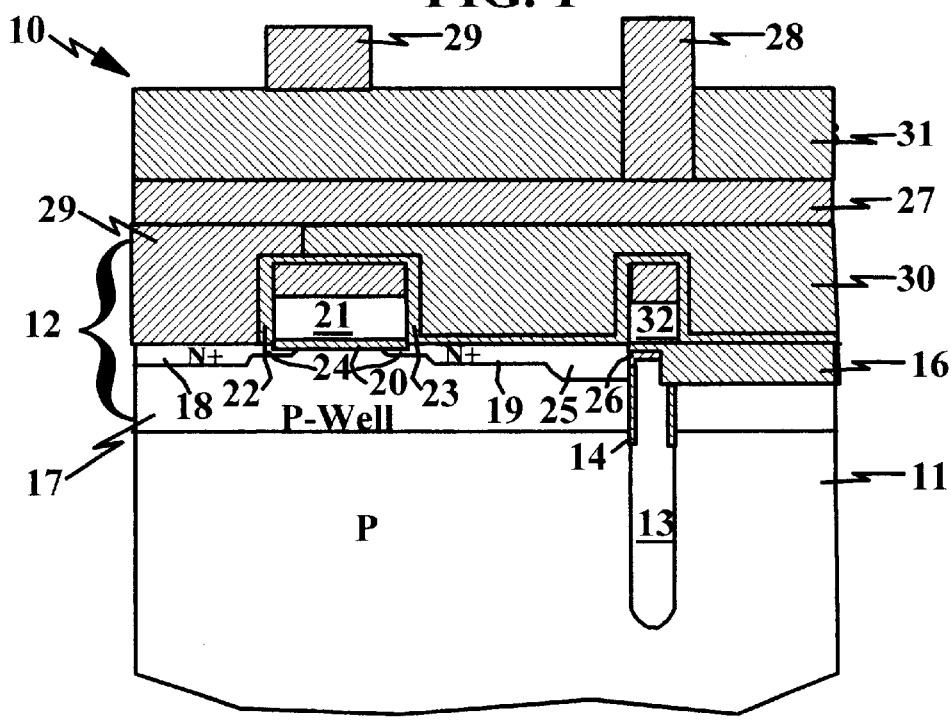
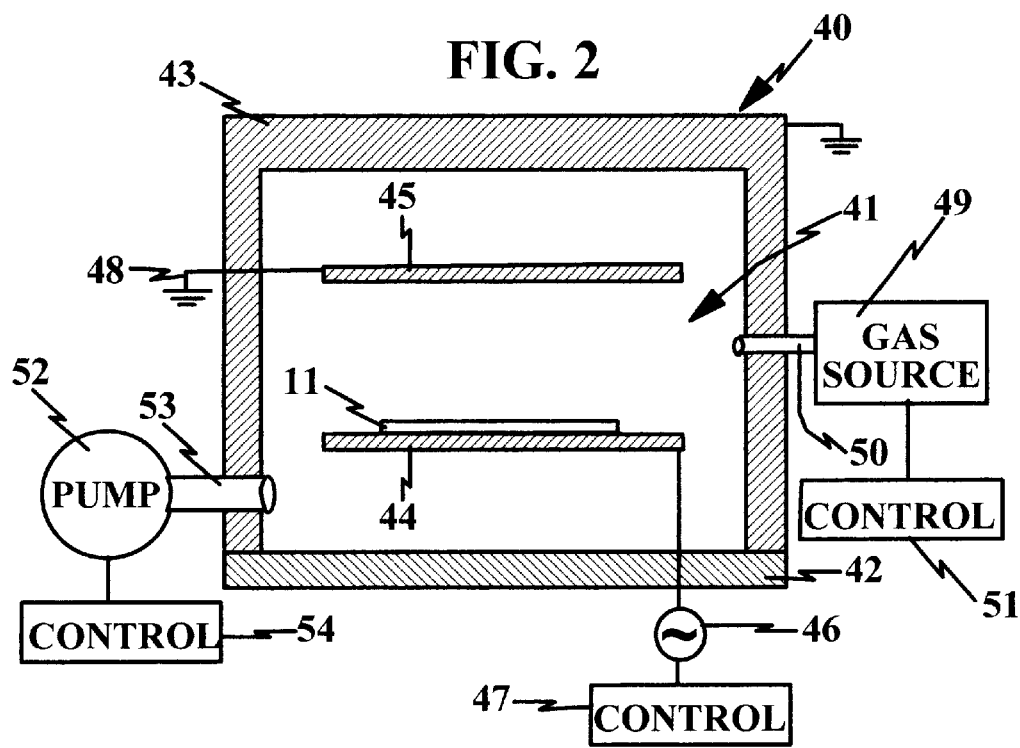

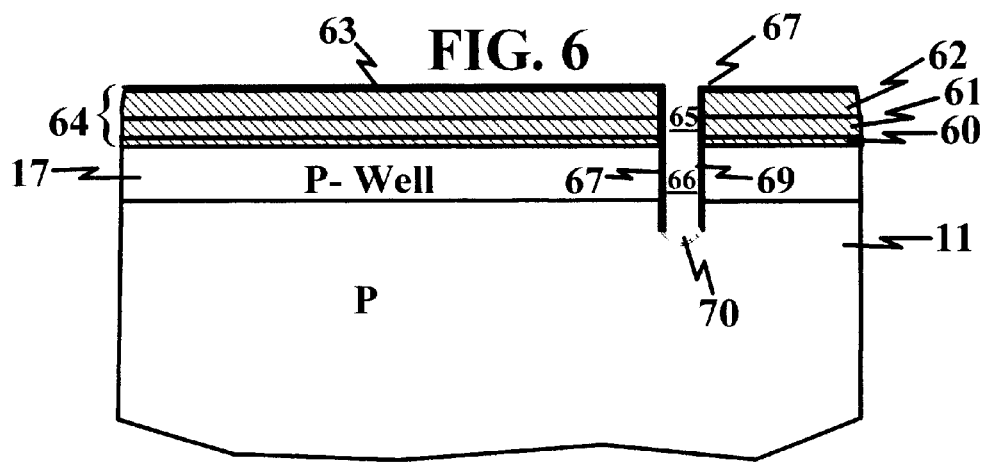
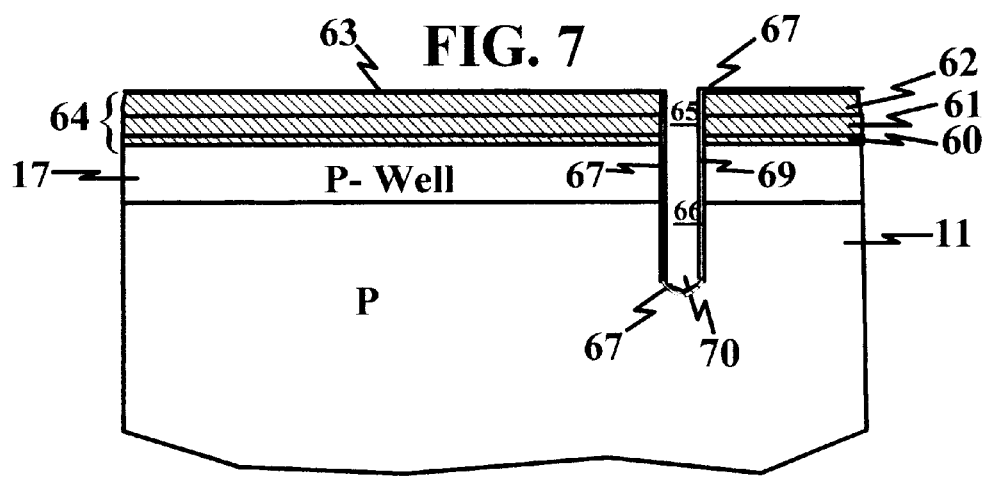
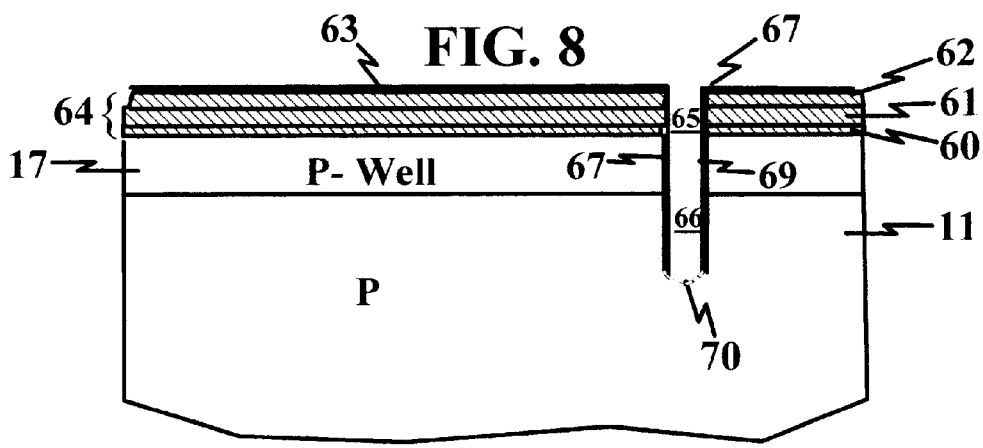

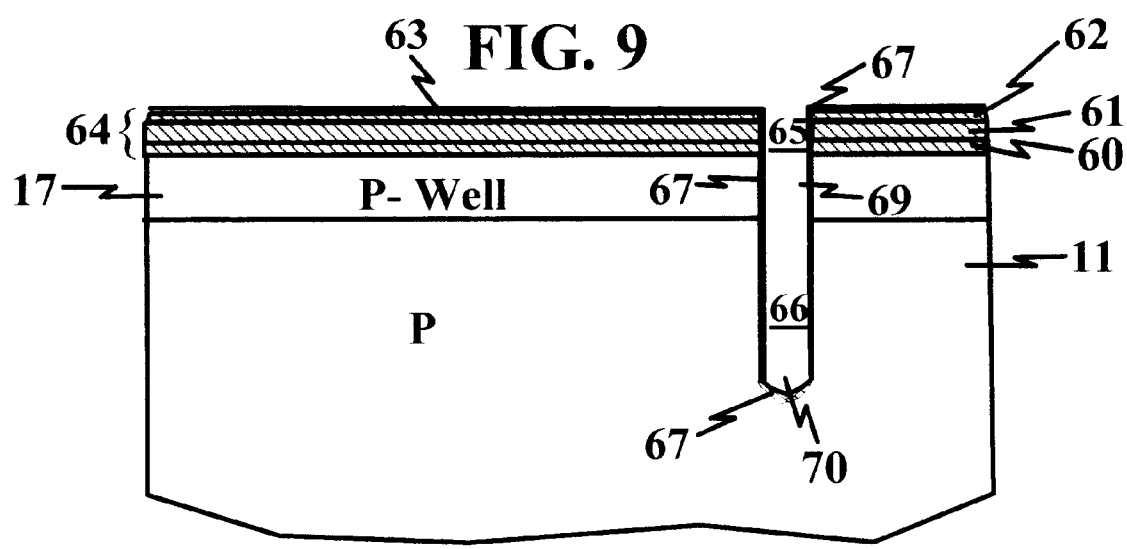

METHOD TO INCREASE THE ETCH RATE AND DEPTH IN HIGH ASPECT RATIO STRUCTURE

FIELD OF THE INVENTION

The present invention relates to semiconductor integrated circuits and, more particularly, to the fabrication of integrated circuits containing high aspect ratio trenches, especially for use in a memory cell.

BACKGROUND OF THE INVENTION

A memory cell in an integrated circuit comprises a transistor with an associated capacitor. The capacitor consists of a pair of conductive layers separated by a dielectric material. Information or data is stored in the memory cell in the form of charge accumulated on the capacitor As the density of integrated circuits with memory cells is increased, the area for the capacitor becomes smaller and the amount of charge it is able to accumulate is reduced. Thus, with less charge to detect, reading the information or data from the memory cell becomes more difficult.

With a limited fixed space or volume for the capacitor of a memory cell in a highly integrated memory cell, there are three techniques for increasing the amount of charge within a fixed space or area; namely, (1) decrease the thickness of the dielectric material, (2) change the dielectric material to one with a higher dielectric constant, and (3) increase the surface area of the space to be used for the capacitor. Only technique (3) is a viable solution because technique (1), reducing the thickness of the dielectric, increases leakage currents which may effect the memory retention performance of the capacitor and the reliability of the memory cell. Technique (2), changing the dielectric material to one with a higher dielectric constant, will only cause a slight improvement in charge storage because the dielectric constant of suitable alternative dielectric materials is only slightly higher than the dielectric constant of the material presently being used. Moreover, the substitution of alternative dielectric materials may be more complicated, more expensive and provide unknown fabrication problems. Accordingly, technique (3), increasing the surface area of the space to be used for the capacitor, provides the most promise for substantially improving the amount of charge stored in a memory cell.

One known solution to increase the surface area of the capacitor is to form a trench capacitor. An increase in the depth of the trench increases the surface area of the capacitor. However, the depth of the trench is limited by present fabrication methods and tools. This problem is compounded by the forever increasing density of integrated circuits which further causes the width of the trench capacitor to be narrowed. To offset the loss of surface area by a reduction in the width, the depth of the trench must be further increased or etched to the point where it becomes aspect ratio dependent.

Aspect ratio dependent behavior of deep trench etching is due to two factors: (1) decrease in etch rate of the substrate, herein silicon, with depth due to reduced solid angle of neutral flux at the bottom of the trench; and (2) incomplete removal of a passivation film which builds up at the bottom of the trench and blocks further etching of the trench. This second factor is due to decreasing ion energy at high aspect ratios and is caused by inelastic scattering of ions from the walls of the trench being etched. An etch stop occurs when the passivation film blocks further etching of the substrate. At very high aspect ratios, factor (2) dominates the slowing the etch rate of the substrate and solutions to overcome factor (1) become ineffective and preclude achieving the desired high aspect ratio trench.

One prior art solution to aspect ratio dependent behavior problem of deep trench etching, as described in U.S. Pat. No. 6,127,278, is to use a sequential multi-step etch, using in the first etch step an etchant composition of HBr and $O_2$, followed by a second etch step using as the etchant a composition of a fluorine-containing gas, HBr and $O_2$. The first etch step allows the formation of a passivation film of the side walls and bottom of the trench being etched while the second etch step removes the passivation film from the side walls and the bottom of the trench during etching by the second etchant. However, the etchant gases of the first etch step does not include any fluorine containing gas which has the advantage of reducing erosion of the hard mask, such as silicon oxide, but the disadvantage of limiting the depth of the trench and the necessity of adding a fluorine containing gas during the second step.

With increasing density of integrated circuits, especially integrated memory circuits, it is critical to have a simple fabrication technique which is easily adaptable for manufacturing a high aspect ratio trench. Accordingly, it is an object of the present invention to design a process for fabricating a high aspect ratio trench in which the formation of a passivation film at the bottom of the trench being etched does not limit the depth of the trench and the throughput of the etching process is high due to its simplicity of the process. Further, it is object of the present invention to design a process for etching high aspect ratio trenches with reduced build-up of a passivation film in the bottom of the trench being etched and is easily removed.

SUMMARY OF THE INVENTION

To achieve these and other objects, a fabrication process of the present invention for forming a high aspect ratio deep trench (DT), such as a deep trench capacitor, comprises reducing the formation of a passivation film during the etching of the trench by including a first step of contacting the substrate in which the deep trench is to be formed with a fluorine poor or low concentration of a fluorine gas in the plasma of etchant gases for etching the high aspect ratio deep trench, followed by a second step, for at least one short period of time, of increasing the concentration of fluorine containing gas to create a fluorine-rich plasma while lowering the chamber pressure of the reactor and RF power to remove the passivation film in the bottom of the trench while essentially leaving the passivation film on the side walls of the trench. Preferably, the second step is introduced periodically during the etching of a deep trench in an alternating manner. Specifically, the fluorine rich etching plasma, for removing the passivation film at the bottom of the trench, is exposed to the passivation film for a time in the range of two (2) to twelve (12) seconds and at a reactor chamber pressure of less than 100 millitorr or between a range of about 1 to about 100 millitorr and a RF power of less than 500 W or between a range of about 200 to about 500 W.

BRIEF DESCRIPTION OF THE DRAWINGS

The invention is best understood from the following detailed description when read in connection with the accompanying drawing. It is emphasized that, according to common practice, the various features of the drawings are not to scale. On the contrary, the dimensions of the various features are arbitrarily expanded or reduced for clarity. Included in the drawings are the following figures:

FIG. 1 is a cross-sectional view of a memory cell of an integrated circuit showing a field effect transistor (FET) and the deep trench of the present invention.

FIG. 2 is cross-sectional views of a conventional reactive ion etcher apparatus used in etching the deep trench of the present invention.

FIGS. 3–9 are cross sectional views a semiconductor wafer at various stages during the fabrication of the deep trench of the present invention.

DETAILED DESCRIPTION OF THE INVENTION

Figure 3:
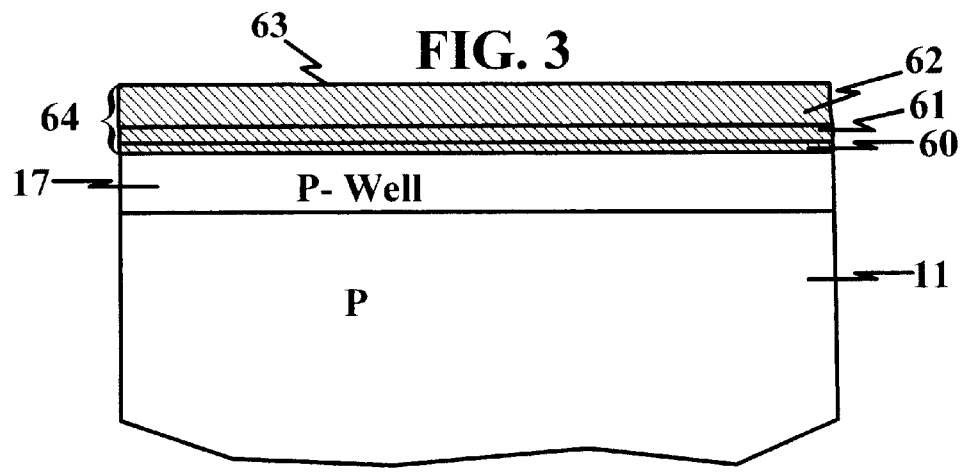

A detailed description of the present invention will now be made by referring to the accompanying drawings. As an example of one utilization of the deep trench of the present invention, FIG. 1 shows the basic parts of a memory cell 10, namely—a transistor and a capacitor, which is fabricated in and on a silicon substrate 11 and which, herein, is one cell of an array of cells of a dynamic random access memory (DRAM). Herein, the memory cell is a CMOS FET and comprises a pair of field effect transistors (FET) of which only one FET 12 is indicated by a bracket. Associated with each FET is at least one trench capacitor, which is connected to and in combination with each FET. In FIG. 1, only one capacitor 13 is shown. The capacitor 13 functions as a charge storage element and as a means for storing data in the memory cell 10. Disposed in the trench is an insulating material, such as silicon oxide, on the side walls and bottom and disposed between insulating material is a conductive material, such as doped polysilicon. At the upper segment of the deep trench capacitor, an oxide collar 14 is disposed around the periphery 15 of the trench and abuts a shallow trench isolation (STI) area 16 on side of the trench 13 opposite the FET 12. Herein, the FET 12 includes a P-Well 17, a N+ source region 18 and a N+ drain region 19 in the silicon substrate 11 on opposite sides of a gate oxide 20 on and in the substrate 11 underlying a gate electrode 21 comprising doped polysilicon and a refractive metal. Insulating sidewalls 22 and 23 are disposed on the gate electrode 21 and were formed after the implantation of the N– impurities adjacent the gate electrode, which created lightly doped drain (LDD) regions 24. The sidewalls 22 and 23 provide a mask for implanting the N+ impurities of the source and drain regions, 18 and 19, respectively. At the same time as the gate electrode 21 is formed, a conductive layer of doped polysilicon and refractive metal is disposed over and insulated from the trench by the STI 16 to provide a passover wordline 32.

Means for physically and electrically connecting the trench capacitor 13 to the FET comprises a deeper N+ region or strap 25 which is disposed in the drain region 19 as shown in FIG. 1. A conductive interposer 26 is positioned at the top of the trench 13 above the oxide collar 14 and abuts the N+ region or strap 25. To interface with other memory cells in the memory array, a bitline 27 extends above the gate electrode 21. Contact 28 is connected to the gate electrode 21 through a path not shown. Contact 29 is connected to the source 18 through a path not shown. Insulating layers 30 and 31 separate the contacts from the bitline and wordline contacts. The wordline, shown as the passover wordline 32, is part of the memory array and, through the interaction of the bitline 27 and the wordline, the capacitor of the present invention is charged and discharged in the writing and reading data into and out of the memory cell shown in FIG. 1. Another FET (not shown) and trench(es) (not shown) may be included in the memory cell adjacent the FET 12. In addition, additional trenches may be included adjacent the trench 13.

Referring now to FIG. 2 to describe a plasma reactor for etching the high aspect deep trench(es), the plasma reactor or reactive ion etcher 40 includes a reactor chamber 41 formed by a insulated base 42 and a grounded conductive enclosure 43. The reactor 40 includes a pair of parallel plates 44 and 45 with the plate 44 connected to a power source 46 with a control apparatus 47 and the plate 45 which is connected to ground 48. The semiconductor wafer 11 is mounted on the plate 44 for both etching of the trench and removal the passivation film. To create the plasma, a gas source 49 and a gas inlet 50, which is shown as single inlet but can be a plurality of inlets disposed around the chamber 41, provide the gas or gases to the chamber. The gases can be mixed in desired proportions and/or changed in concentration by an control apparatus 51 connected to the gas source. To regulate the pressure of the chamber 41, a pump 52 with an inlet 53 connected to the chamber and the pump is controlled by control apparatus 54. During etching of a high aspect deep trench(es) in the wafer 11, an etchant gas or gases flow through the inlet 53 to the chamber 41 with the RF power source 46 turned on. Preferably, the power source 46 is set at about 1500 watts at a frequency of 13.56 megahertz by the control apparatus 47. In accordance with the present invention, the power source 46 is regulated by the control apparatus 47 during etching of the trench(es). During etching, the initial pressure is preferably about 200 millitorr but can be as high as 500 millitorr. The pressure also is regulated during etching of the trench(es) by control apparatus 54 of the pump 52.

Deep trench etching can result in the formation of black silicon which is caused by the presence of surface contaminates such as residual oxides that act as a localized etch mask. A etch method for eliminating/minimizing the formation of black silicon is disclosed and claimed in patent application Ser. No. 09/675,433, filed Sep. 29, 2000 and that application is incorporated by reference herein.

Figure 4:
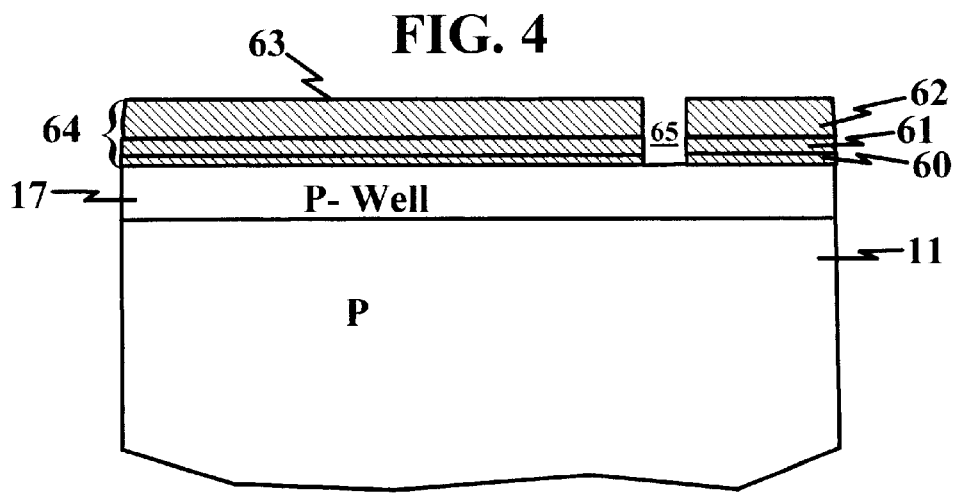

Turning now to FIGS. 3–8, a silicon wafer 11, herein P doped and with a P-well 17 for the fabrication of a CMOS, is formed with a hard mask 64 which preferably comprises a layer of a pad silicon oxide 60, a layer of silicon nitride 61 thereon, and, as the top layer, a layer of BSG/TEOS (borosilicate glass/ tetraethyloxysilicate ) 62, with a top surface 63, as shown in FIG. 3. The oxide layer 60 is thermally grown while the nitride layer 61 and the BSG/TEOS are chemically vapor deposited as is well know in the art. Preferably, the BSG/TEOS is one micron thick because, being the top layer of the hard mask, it will be eroded during etching as will be shown in FIGS. 5 through 8. A photoresist (not shown) is deposited on the BSG/TEOS as a hard mask and exposed and developed to create one or more openings in the photoresist for forming trenches in the wafer 11. The hard mask 64 is plasma etched in an anisotropic manner using the reactive ion etcher (RIE) 40 (FIG. 2) for reactive ion etching the hard mask in the opening(s) formed in the photoresist with the appropriate plasma gases as known in the art to form mask opening(s) 65 as shown in FIG. 4.

Figure 5:
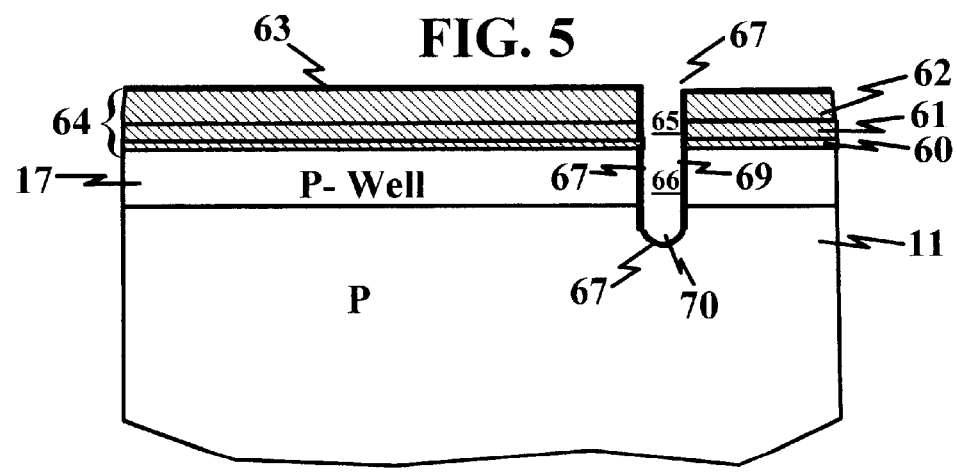

Following the mask opening, a deep trench(es) 66 as shown in FIG. 5 is formed in the wafer 11 by a multi-step method preferably as described in patent application Ser. No. 09/675,433, filed Sep. 29, 2000 as modified by the method of the present invention. The inventive method comprises etching the semiconductor substrate 11, herein silicon, at the mask opening(s) with a plasma gas comprising a fluorine gas and oxygen along with hydrogen bromide (HBr), herein in an anisotropic manner using RIE apparatus described in conjunction with FIG. 2. During the deep trench etching, continuous deposition and etching reactions take place on surface of the mask 63, side walls of the trench and bottom of the trench, which creates a passivation film 67 on the top surface 63 of the mask 64, the side walls 69 of the trench and the bottom 70 of the trench as shown in FIG. 5. It will be noted that thickness of the BSG/TEOS layer 62 is shown to be slightly less than the thickness of the BSG/TEOS layer in FIG. 4 before it was exposed to etching.

In accordance with the present invention, the passivation film 67 at the bottom 70 of the trench 66 is removed periodically as shown in FIGS. 6 and 8 by introducing a fluorine-rich plasma and hydrogen bromide at low press and low power. Although the bottom passivation film 67 is removed, the film on the side walls is not or, if it is, removal is minimal, thereby protecting the trench 66 from lateral etching which becomes more critical with decreasing groundrules. Preferably, during etching, the plasma gas mixture is $NF_3/HBr/O_2$. For passivation film removal, the $NF_3$ is increased, with the HBr remaining at the same concentration, and the source of $O_2$ is shut off The pressure is reduced to <100 millitorr and the RF power is reduced to 500. Herein, the range of the specific plasma gas mixture is $10NF_30-50$ HBr for the passivation film removal. Although $NF_3$ is preferred, other fluorine containing compounds, such as $SiF_4$ and $SF_6$ may be used for both DT etching and passivation film removal. A cycle of the invention of the present invention comprises etch in minutes, passivation film remove in seconds and etch in minutes. FIGS. 7, 8 and 9 show this cycle. FIG. 7 is the etch step with both etching of the trench 66 and a buildup of the passivation film 67 on the bottom 70 of the trench. FIG. 8 shows the in situ passivation removal step at the bottom 70 of the trench 66. After removal of the passivation film 67, the trench 66 is etched deeper at a higher etch rate with again a buildup of the passivation film.

A prior art etch method of etching for eight and one-half (8½) minutes without any passivation film removal resulted in a trench depth of 6.2 μm with 0.15 μm groundrules. By adding an extra minute of etching to this prior art method, a trench depth of 6.4 μm resulted. However, by adding the passivation film removal step of the present invention before etching an extra minute resulted in a trench depth of 6.5 μm. Further, by adding an extra two minutes of etch time beyond the 8½ minutes of this prior art method, again without a film removal step, a trench depth of 6.6 μm resulted. In contrast, a trench depth of 6.9 μm resulted when the sequence was two extra minutes of etch time with the passivation film removal step of the present invention. FIGS. 7 and 9 show the additional trench depth achieved with the passivation film removal step. This FIGURES also show the reduced thickness of the BSG/TEOS layer. It is desired not to reach the silicon nitride layer 61 in etching the trench(es) 66 and etching is normally stopped after 0.9 μm of the BSG/TEOS has been eroded of the beginning thickness of 1 μm. If difference thickness of BSG/TEOS are used, it is desired to stop when 0.1 μm of the BSG/TEOS remains.

It was found that the above added etching time to the prior art method without the passivation film removal step of the present invention, only gave an etch rate of 0.2 μm/min whereas with passivation film removal step, the etch rate increased to 0.35 μm/min, thereby establishing that the etch rate is decreased by the passivation film at the bottom of the trench. Accordingly, it is desirable to predetermine or set the etch rate to be at least 0.35 μm/min. It further was found that the time of in-situ passivation film removal step does not increase the trench depth because the depth did not increase when a 15 second removal step was used rather than a 7 second removal step. In addition, the passivation film removal step does not significantly widen the trench top opening, thus confirming that the passivation film removal step of the present invention removes predominately the passivation film at the bottom of the trench. These results and a comparison with the deep trench etch of the prior art and the inventive method is in the table below:

| Method | Etch Time - Min | Trench Depth - μm | Etch Rate μm/Min |
|---|---|---|---|
| Prior Art DT etch | 8.5 | 6.2 | — |
| Prior Art DT etch plus 1 min additional etch | 9.5 | 6.4 | 0.2 |
| Inventive DT etch plus 7 sec film removal plus 1 min additional etch | 9.5 | 6.5 | 0.35 |
| Prior Art DT etch plus 2 min additional etch | 10.5 | 6.6 | 0.2 |
| Inventive DT etch plus 7 sec film removal plus 2 min additional etch | 10.5 | 6.9 | 0.35 |

As seen in the above table the method of the present invention results in a deeper etch for the same etch time due a greater etch rate. Yet only a short time, 7 seconds, is needed to remove the passivation film from the bottom of the trench thereby not substantially affecting the throughput of the etching of the deep trench. Further, by keeping the removal of the passivation film at the bottom of the trench as short as possible, such as less than 15 seconds, the BSG/TEOS 62 of the hard mask 64 is not eroded. Moreover, it was found that increasing the time to remove the passivation film, such as 15 seconds, does not increase the etch rate or result in a deeper trench. In addition, the non removal of the passivation film 69 on the side walls of the trench 66 in FIGS. 5–8 prevents etching of the side walls and precludes widening of the trench during etching. In FIG. 5, the passivation film 67 is on the side walls 69 and the bottom 70, but after the passivation film removal step, the film 67 remains on the side wall 69 and is removed from the bottom of the trench 66 as shown in FIG. 6. The trench is further etched in FIG. 7 to deepen it and, in doing so, the passivation film 67 again forms on the bottom 70 of the trench 66. After an additional passivation removal step as shown in FIG. 8, the film 67 is removed from the bottom 70 in preparation for further etching to deepen the trench as shown in FIG. 9. It will noted that the BSG/TEOS layer 62 becomes thinner and thinner in FIGS. 5–8 until, in FIG. 9, it is approaching a thickness, namely—0.1 μm, at which further etching is not desirable.

Although this invention has been described relative to particular embodiments, it will be apparent to those skilled in the art that various changes and modification may be made without departing from the spirit and scope of the inventions defined in the following claims

What is claimed is:

1. A method of fabricating a trench in a semiconductor substrate comprising the steps of:

providing a semiconductor having an upper surface and with a patterned mask on said surface, the mask formed with a top layer and having at least one opening where the upper surface of the semiconductor substrate is exposed;

etching said semiconductor substrate at said opening by plasma etching to form a trench in said substrate at said opening;

contacting said trench with a fluorine-containing oxygen-free plasma at reduced pressure and power compared to said prior etching step to form the trench, whereby a passivation film formed at the bottom of the trench during the prior etching step is removed; and further etching said semiconductor substrate at said opening to deepen said trench.

2. The method of claim 1 wherein the passivation film remains on the side walls of the trench but not the bottom after performing the passivation film removal step.

3. The method of claim 1 wherein the same fluorine containing compound in the plasma is used for both etching the trench and removal of the passivation film.

4. The method of claim 1 wherein the fluorine-containing plasma for removing the passivation film is exposed to the passivation film for a time in the range of two (2) to twelve (12) seconds and at a reactor chamber pressure of less than 100 millitorr and a RF power of less than 500 W.

5. The method of claim 4 wherein the reactor chamber pressure is between a range of about 1 to about 100 millitorr and the RF power is between a range of about 200 to about 500 W.

6. The method of claim 1 wherein said etching of the trench is performed at predetermined etch rate and the passivation film in the bottom of trench decreases the etch rate.

7. The method of claim 6 wherein said etch rate is at least 0.35 $\mu$m/min.

8. The method of claim 1 wherein the time for the removal of the passivation film is less than 15 seconds.

9. The method of claim 1 wherein the desired depth of the trench is achieved before the top layer of the mask is etched away.

10. The method of claim 1 wherein the plasma etching comprises a fluorine containing compound and oxygen.

11. In the fabrication of a memory cell comprising a transistor and a deep trench capacitor, the method of forming the deep trench for the capacitor comprising the steps of:

providing a semiconductor having an upper surface and with a patterned mask on said surface, the mask formed with a top layer and having at least one opening where the upper surface of the semiconductor substrate is exposed;

etching said semiconductor substrate at said opening by plasma etching to form a trench in said substrate at said opening;

contacting said trench with a fluorine-containing oxygen-free plasma at reduced pressure and power compared to said prior etching step to form the trench, whereby a passivation film formed at the bottom of the trench during the prior etching step is removed;

further etching said semiconductor substrate at said opening to deepen said trench;

repeating the passivation film removal steps and etching until the desired depth of the trench has been achieved and before erosion of the top layer of the mask;

removing the passivation film from side walls and bottom of the trench;

forming an insulating layer on the side walls and bottom of the trench; and filling the trench with a conductive material.

12. The method of claim 11 wherein the passivation film remains on the side walls of the trench but not the bottom after performing the passivation film removal step.

13. The method of claim 11 wherein the same fluorine containing compound in the plasma is used for both etching the trench and removal of the passivation film.

14. The method of claim 11 wherein the fluorine containing etching plasma for removing the passivation film is exposed to the passivation film for a time in the range of two (2) to twelve (12) seconds and at a reactor chamber pressure of less than 100 millitorr and a RF power of less than 500 W.

15. The method of claim 14 wherein the reactor chamber pressure is between a range of about 1 to about 100 millitorr and the RF power is between a range of about 200 to about 500 W.

16. The method of claim 11 wherein said etching of the trench is performed at predetermined etch rate and the passivation film in the bottom of trench decreases the etch rate.

17. The method of claim 16 wherein said etch rate is at least 0.35 $\mu$m/min.

18. The method of claim 11 wherein the plasma etching comprises a fluorine containing compound and oxygen.

* * * * *